US012633505B2

(12) United States Patent
Hada et al.

(10) Patent No.: US 12,633,505 B2
(45) Date of Patent: May 19, 2026

(54) ANALYSIS DEVICE, ANALYSIS METHOD, AND ANALYSIS PROGRAM

(71) Applicant: HORIBA STEC, Co., Ltd., Kyoto (JP)

(72) Inventors: Miyako Hada, Kyoto (JP); Motonobu Takahashi, Kyoto (JP); Masakazu Minami, Kyoto (JP); Yuhei Sakaguchi, Kyoto (JP); Toru Shimizu, Kyoto (JP); Tetsuo Fujii, Kyoto (JP)

(73) Assignee: HORIBA STEC, CO., LTD., Kyoto (JP)

( * ) Notice: Subject to any disclaimer, the term of this patent is extended or adjusted under 35 U.S.C. 154(b) by 415 days.

(21) Appl. No.: 18/222,029

(22) Filed: Jul. 14, 2023

(65) Prior Publication Data

US 2024/0030013 A1    Jan. 25, 2024

(30) Foreign Application Priority Data

Jul. 20, 2022    (JP) ................................. 2022-115468

(51) Int. Cl.
*H01J 37/32*        (2006.01)
*H10P 72/00*        (2026.01)

(52) U.S. Cl.
CPC .. *H01J 37/32981* (2013.01); *H01J 37/32926* (2013.01); *H10P 72/0421* (2026.01);
(Continued)

(58) Field of Classification Search
None
See application file for complete search history.

(56) References Cited

U.S. PATENT DOCUMENTS 5,980,766 A    11/1999  Flamm et al.
6,493,086 B1 *  12/2002  McAndrew ......... C23C 16/4412
250/341.4

(Continued)

FOREIGN PATENT DOCUMENTS

EP        3561861 A1 *  10/2019  ....... H01L 21/67248
JP    2002-170812        6/2002

(Continued)

OTHER PUBLICATIONS

Dec. 18, 2023 Extended European Search Report in European patent application No. 23186076.8.
(Continued)

*Primary Examiner* — Sylvia Macarthur
(74) *Attorney, Agent, or Firm* — GREENBLUM & BERNSTEIN, P.L.C.

(57)        ABSTRACT

The present invention is aimed to perform precise monitoring of the processed amount by which a workpiece is processed, and includes a measurement unit that measures a concentration or a partial pressure of a reaction product generated while the workpiece is being processed, and an operation unit that calculates the processed amount of the workpiece using an output value of the measurement unit. The measurement unit includes: a laser light source that irradiates target gas containing the reaction product with a laser beam; a photodetector that detects a laser beam having passed through the target gas; and a signal processing unit that calculates the concentration or the partial pressure of the reaction product based on a detection signal of the photodetector. The operation unit includes a time integration unit.

10 Claims, 11 Drawing Sheets

(52) U.S. Cl.
CPC .. *H10P 72/0604* (2026.01); *H01J 2237/2445*
(2013.01); *H01J 2237/3341* (2013.01)

(56) References Cited

U.S. PATENT DOCUMENTS

| | | | | |
|---|---|---|---|---|
| 7,645,704 | B2 * | 1/2010 | Shi | B81C 1/00531 |
| | | | | 438/723 |
| 9,443,704 | B2 * | 9/2016 | Asakura | H01J 37/3299 |
| 10,262,842 | B2 * | 4/2019 | Asakura | H01J 37/32972 |
| 2005/0199341 | A1 * | 9/2005 | Delp | H01J 37/32 |
| | | | | 156/345.24 |
| 2006/0042544 | A1 * | 3/2006 | Hasebe | C23C 16/4412 |
| | | | | 134/1 |
| 2017/0138837 | A1 * | 5/2017 | Yamaguchi | G01N 15/0211 |
| 2023/0417660 | A1 * | 12/2023 | Sakaguchi | G01N 21/031 |
| 2024/0030013 | A1 * | 1/2024 | Hada | H01L 21/67069 |

FOREIGN PATENT DOCUMENTS

| | | | | | |
|---|---|---|---|---|---|
| JP | 2012032239 | A | * | 2/2012 | G01B 11/0625 |
| JP | 6886507 | | | 6/2021 | |
| WO | 2022/118694 | | | 6/2022 | |

OTHER PUBLICATIONS

Zimmermann S. et al: "The role of plasma analytics in leading-edge semiconductor technologies", Contributions to Plasma Physics, Akademie Verlag, Berlin, DE, vol. 58, No. 5, Feb. 14, 2018, pp. 367-376.

Lang N et al: "On treatment of ultra-low-k SiCOH in CF4 plasmas: correlation between the concentration of etching products and etching rate", Applied Physics B, Springer Berlin Heidelberg, Berlin/Heidelberg, vol. 119, No. 1, Mar. 7, 2015, pp. 219-226.

Lang N et al: "Wafer2Wafer Etch Monitor via In Situ QCLAS", IEEE Transactions on Plasma Science, IEEE Service Center, Piscataway, NJ, US, vol. 37, No. 12, Dec. 11, 2009, pp. 2335-2341.

Hada Miyako et al: "Chamber in-situ estimation during etching process by SiF4 monitoring using laser absorption spectroscopy", Japanese Journal of Applied Physics, vol. 62, No. SI, May 24, 2023, p. SI1013-1 to SI1013-6, Retrieved from the Internet: URL: https://iopscience.iop.org/article/10.35848/1347-4065/accc95/pdf.

* cited by examiner

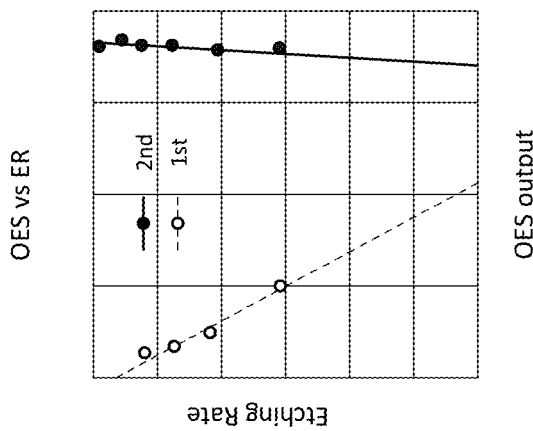
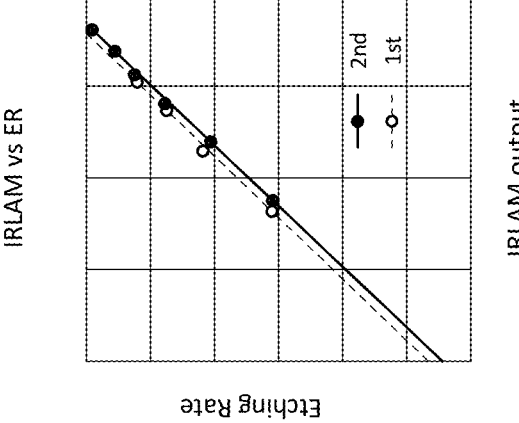
FIG.6

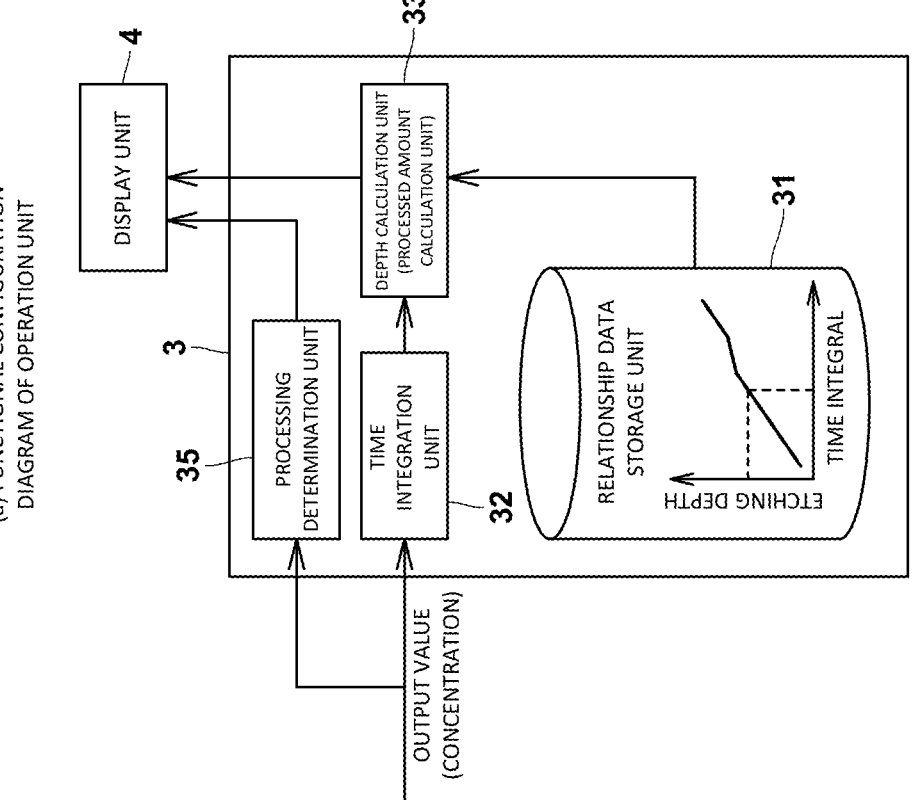

FIG. 9B (b) DIAGRAM FOR EXPLAINING PROCESSING DETERMINATION

CHANGE IN OUTPUT VALUE => ETCHING RATE IS TEMPORALLY UNSTABLE

OUTPUT VALUE OF MEASUREMENT UNIT

Elapsed time

FIG. 9A (a) FUNCTIONAL CONFIGURATION DIAGRAM OF OPERATION UNIT

DISPLAY UNIT — 4

PROCESSING DETERMINATION UNIT — 35

3

DEPTH CALCULATION UNIT (PROCESSED AMOUNT CALCULATION UNIT) — 33

TIME INTEGRATION UNIT — 32

RELATIONSHIP DATA STORAGE UNIT — 31

ETCHING DEPTH / TIME INTEGRAL

OUTPUT VALUE (CONCENTRATION)

FIG. 10B (b) DIAGRAM FOR EXPLAINING VARIATION CALCULATION

Figures 10A, 10B:
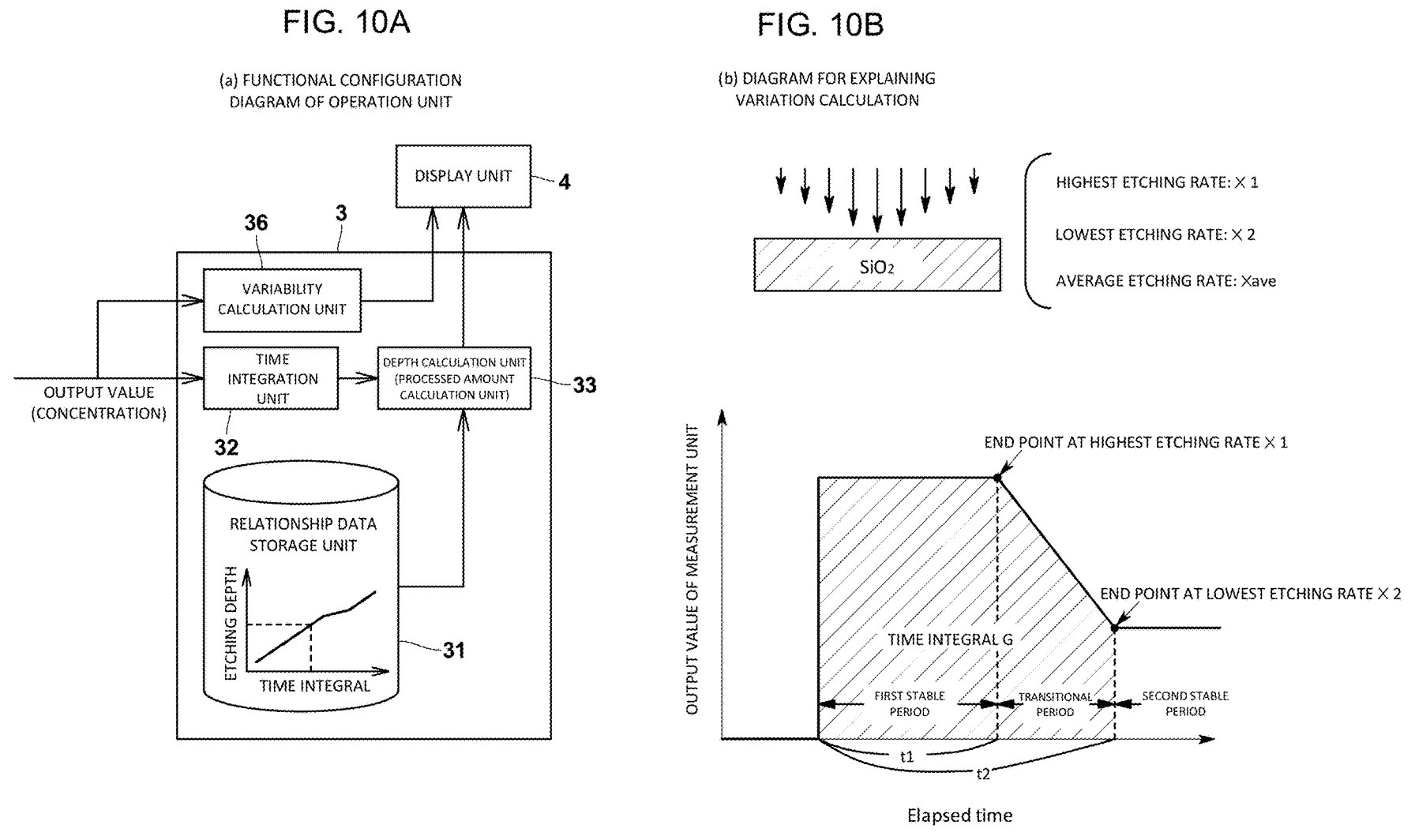

HIGHEST ETCHING RATE: ×1

LOWEST ETCHING RATE: ×2

AVERAGE ETCHING RATE: Xave

SiO₂

END POINT AT HIGHEST ETCHING RATE ×1

END POINT AT LOWEST ETCHING RATE ×2

TIME INTEGRAL G

FIRST STABLE PERIOD

TRANSITIONAL PERIOD

SECOND STABLE PERIOD t1 t2

Elapsed time

OUTPUT VALUE OF MEASUREMENT UNIT

FIG. 10A (a) FUNCTIONAL CONFIGURATION DIAGRAM OF OPERATION UNIT

DISPLAY UNIT    4

DEPTH CALCULATION UNIT (PROCESSED AMOUNT CALCULATION UNIT)    33

VARIABILITY CALCULATION UNIT    36

3

TIME INTEGRATION UNIT    32

RELATIONSHIP DATA STORAGE UNIT    31

ETCHING DEPTH

TIME INTEGRAL

OUTPUT VALUE (CONCENTRATION)

ANALYSIS DEVICE, ANALYSIS METHOD, AND ANALYSIS PROGRAM

The present application claims priority to Japan Patent Application No. 2022-115468 filed Jul. 20, 2022, which is incorporated herein by reference in its entirety.

BACKGROUND OF THE INVENTION

1. Technical Field

The present invention relates to an analysis device, an analysis method, and an analysis program used in processing such as semiconductor processing.

2. Description of the Related Art

Conventionally, plasma emission monitors (optical emission spectrometers (OESs)) such as that disclosed in JP 2002-170812A have been put in use in semiconductor processing to monitor the point where etching processing is to be ended (etching depth), for example.

Since such an OES detects the optical plasma emission resultant of the actions of plasma, an OES cannot be used in etching processing that does not use any plasma. The output values from OESs vary among the processing runs, the days, or the individual units, due to factors such as a difference in individual processing chambers or OESs, errors in the positions where the processing chamber or the OES is mounted, contamination of the window by contaminants such as process gas or reaction products, or the state of light-emitting species. For these reasons, the OES is not capable of acquiring highly reproducible data, and therefore, an end point determination is made by making relative use of the output values of the OES based on the tendency of a change in the output values.

Also used in endpoint monitoring is an analysis device (non-dispersive infrared (NDIR) analysis device) that uses the NDIR absorption. However, the resolution (sensitivity) of such an NDIR analysis device is not sufficient to make a precise endpoint measurement. In particular, due to recent advancements in semiconductor miniaturization, measurement errors due to insufficient resolution (sensitivity) becomes more prominent as the size of a semiconductor node (minimum line width) becomes smaller.

PRIOR ART DOCUMENT

Patent Document

Patent Document 1: JP 2002-170812A

SUMMARY OF THE INVENTION

The present invention has been made to address the disadvantages described above, and a main object of the present invention is to monitor the processed amount by which a workpiece is processed in the workpiece processing, precisely.

In other words, an analysis device according to the present invention includes: a measurement unit that measures a concentration, a partial pressure, or a value related to the concentration or the partial pressure of a reaction product generated while a workpiece is being processed in workpiece processing; and an operation unit that calculates a processed amount by which the workpiece is processed, using an output value of the measurement unit, in which the measurement unit includes: a laser light source that irradiates target gas containing the reaction product with a laser beam; a photodetector that detects a laser beam having passed through the target gas; and a signal processing unit that calculates the concentration, the partial pressure, or the value related to the concentration or the partial pressure of the reaction product based on a detection signal of the photodetector, and the operation unit includes: a time integration unit that calculates a time integral by integrating an output value of the measurement unit with respect to time; and a relationship data storage unit that stores therein relationship data indicating a relationship between the time integral of integrating the output value of the measurement unit with respect to time, and a processed amount by which the workpiece is processed; and a processed amount calculation unit that calculates a processed amount by which the workpiece has been processed, from the time integral obtained by the time integration unit, and the relationship data.

With such an analysis device, because laser spectroscopy is used to measure the reaction product generated as the workpiece is processed in the workpiece processing, it is possible to measure the concentration, the partial pressure, or the value related to the concentration or the partial pressure of the reaction product, precisely. Furthermore, because the processed amount by which the workpiece has been processed is calculated using the relationship between a time integral resultant of integrating the output values of the measurement unit with respect to time, and the processed amount by which a workpiece is processed, it is possible to monitor the processed amount by which the workpiece is processed, precisely.

The operation unit preferably further includes a processing determination unit that determines that a speed at which the workpiece is processed has changed, based on a temporal change in the output value of the measurement unit.

With this configuration, when the output value of the measurement unit changes while the same film or substance is being processed, for example, it is possible to recognize that the speed at which the film or substance is being processed has changed.

As mentioned earlier, in semiconductor processing such as etching processing, the speed at which a workpiece is processed (etching rate) may vary across a plane. In order to calculate such a variation across a plane, the operation unit preferably further includes a variability calculation unit that calculates the variability in the processed amount across a plane of the workpiece based on a temporal change in the output value of the measurement unit.

In order to measure the concentration, the partial pressure, or the value related to the concentration or the partial pressure of the reaction product more precisely using multi-reflection laser spectroscopy, the measurement unit preferably further includes multi-reflection mirrors, the laser light source causes a laser beam to become incident between the multi-reflection mirrors, and the photodetector detects light emitted from between the multi-reflection mirrors.

In semiconductor processing such as etching processing, the speed at which a workpiece is processed (etching rate) may vary across a plane. This distribution of the processing speed across the plane can be determined using the degree by which a reaction product is generated, and this degree of the reaction product generation can be determined based on the output values of the measurement unit. Therefore, the operation unit preferably further includes a uniformity determination unit that determines a uniformity of the processed amount of the workpiece based on a temporal change in the output value of the measurement unit.

As a specific embodiment, the uniformity determination unit may determine the uniformity in the processed amount of the workpiece, based on a gradient of the temporal change in the output values of the measurement unit.

For example, let us assume herein that the workpiece has a first layer, and a second layer below the first layer, and the amount of the reaction product generated per unit time in etching the first layer is different from that generated per unit time in etching the second layer. In this case, if the distribution of the etching rate across the plane is highly uniform, the gradient of the temporal change in the output values of the measurement unit increases at the time at which the layer being etched changes from the first layer to the second layer. By contrast, if the uniformity in the distribution of the etching rate across the plane is low, the gradient of the temporal change in the output values of the measurement unit decreases at the time at which the layer being etched changes from the first layer to the second layer.

In order to reduce error factors such as the component adhered inside of the process chamber and contamination of the optical window, and to measure the reaction product precisely, the measurement unit preferably has a zero calibration function for performing zero calibration with no workpiece being processed. More specifically, the measurement unit preferably has a zero calibration function for performing zero calibration while there is no reaction product in the process chamber, for example, (1) in a condition in which the workpiece is not being processed and the process chamber has been vacuumed, or (2) in a condition in which the workpiece is not being processed and a flow of inert gas such as nitrogen or argon is being introduced into the process chamber.

As the laser light source, it is possible to use a semiconductor laser, and the semiconductor laser is preferably a quantum-cascade laser.

A quantum-cascade laser is the only feasible semiconductor laser that is capable of oscillating a wavelength in the mid-infrared range at a room temperature. Because many gas molecules exhibit large absorption in the mid-infrared range, it is possible to improve the analysis device.

In addition, as a method for creating the relationship data of the analysis device described above, for example, it is possible to use a method for measuring the processed amounts at a plurality of respective points of a processed workpiece, using an ellipsometer or the like, and establishing a correlation between an average of the processed amounts at the plurality of respective points, and a time integral of the output values of the measurement unit.

However, it is not only required to measure the processed amounts at a plurality of respective points so that the work becomes complicated, but also an error may be introduced by averaging.

Addressing this issue, a method of creating relationship data for an analysis device according the present invention includes: processing a workpiece in workpiece processing; calculating a time integral by integrating an output value of the measurement unit with respect to time; calculating a processed amount, from a weight of the workpiece having been processed; and generating the relationship data from the time integral thus calculated and the processed amount thus calculated.

With such a method of creating the relationship data for an analysis device, because the processed amount is calculated from the weight of the processed workpiece, the creation of the relationship data is simplified, and the precise relationship data can be created.

Furthermore, an analysis method according to the present invention is an analysis method using a measurement unit that measures a concentration, a partial pressure, or a value related to the concentration or the partial pressure of a reaction product generated while a workpiece is being processed in workpiece processing, in which the measurement unit includes: a laser light source that irradiates target gas containing the reaction product with a laser beam; a photodetector that detects a laser beam having passed through the target gas; and a signal processing unit that calculates the concentration, the partial pressure, or the value related to the concentration or the partial pressure of the reaction product based on a detection signal of the photodetector, and the analysis method includes: calculating a time integral by integrating an output value of the measurement unit with respect to time; and calculating the processed amount of the workpiece using relationship data indicating a relationship between the time integral of integrating the output value of the measurement unit with respect to time, and the processed amount of the workpiece.

In addition, an analysis program according to the present invention is used in an analysis device including a measurement unit for measuring a concentration, a partial pressure, or a value related to the concentration or the partial pressure of a reaction product generated while a workpiece is being processed in workpiece processing, and calculates a processed amount by which the workpiece is processed using an output value of the measurement unit, in which the measurement unit includes: a laser light source that irradiates target gas containing the reaction product with a laser beam; a photodetector that detects a laser beam having passed through the target gas; and a signal processing unit that calculates the concentration, the partial pressure, or the value related to the concentration or the partial pressure of the reaction product based on a detection signal of the photodetector, and the analysis program causes a computer to execute functions as: a time integration unit that calculates a time integral obtained by integrating the output value of the measurement unit with respect to time; a relationship data storage unit that stores therein relationship data indicating a relationship between the time integral of integrating the output value of the measurement unit with respect to time, and a processed amount by which the workpiece is processed and a processed amount calculation unit that calculates a processed amount by which the workpiece has been processed, from the time integral obtained by the time integration unit, and the relationship data.

According to the present invention having the configurations described above, it is possible to monitor the processed amount by which a workpiece is processed, precisely, in the processing of the workpiece.

BRIEF DESCRIPTION OF THE DRAWINGS

FIG. 6 is an experimental results indicating a correlation between the output values and the etching rate in the measurement unit according to the same embodiment, and a correlation between the output values and the etching rate in a conventional plasma emission monitor (OES);

FIG. 9A is a functional configuration diagram of an operation unit according to a modification;

FIG. 9B is a diagram for explaining a processing determination;

FIG. 10A is a functional configuration diagram of an operation unit according to the modification;

FIG. 10B is a diagram for explaining variation calculation; and

DETAILED DESCRIPTION

Figure 1:
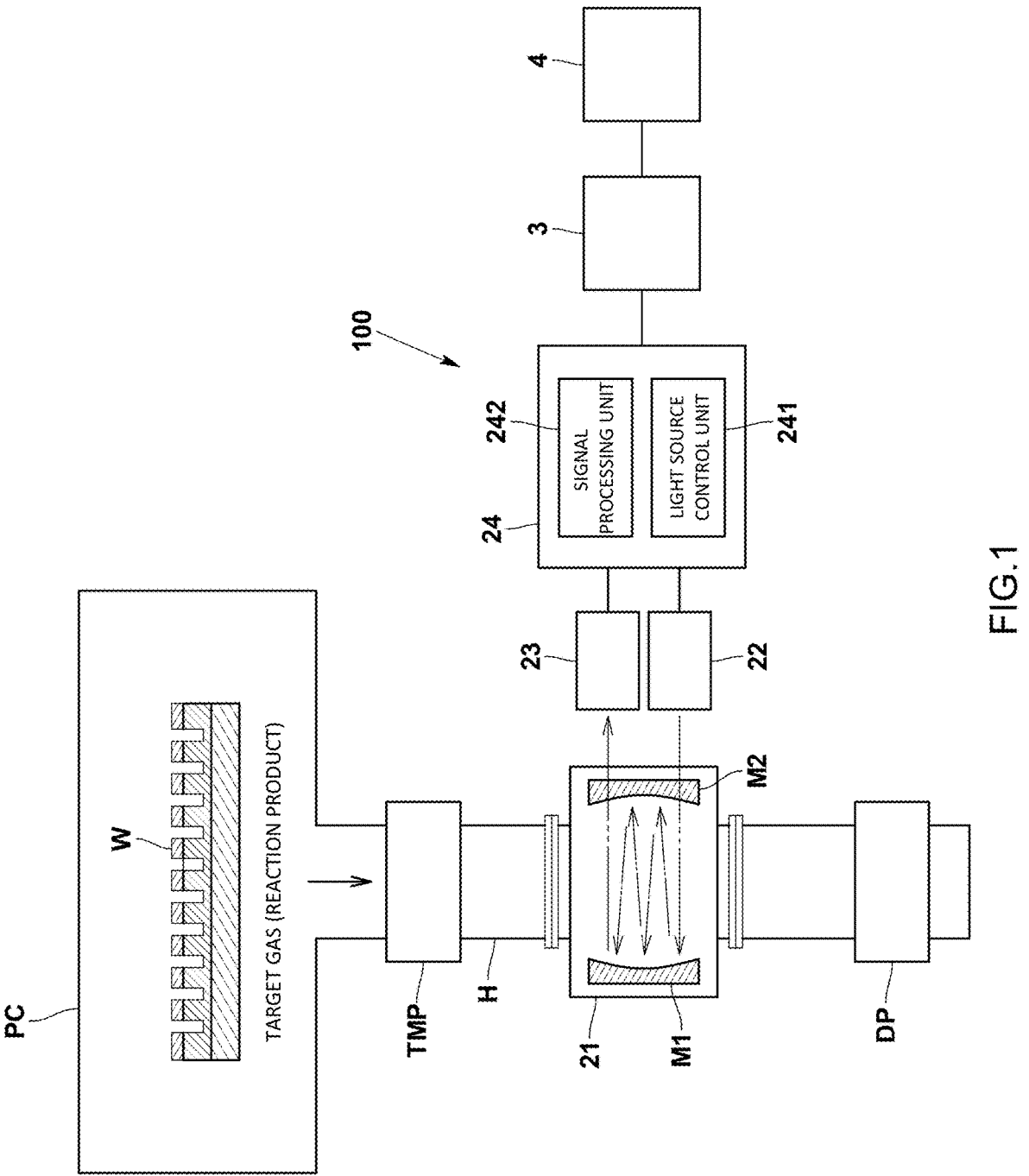
FIG. 1 is a schematic diagram of an analysis device according to one embodiment of the present invention.

An embodiment of an analysis device according to the present invention will now be explained with reference to some drawings.

Note that, to facilitate understanding, all of the drawings described below are schematic representations with some omissions and exaggerations made as appropriate. The same elements are denoted by the same reference numerals, and the descriptions thereof will be omitted as appropriate.

An analysis device 100 according to this embodiment is for monitoring an etching depth of a workpiece W to be etched. The analysis device 100 measures the concentration or the partial pressure, or a value related to the concentration or the partial pressure of a reaction product generated as the workpiece W is etched, and obtains an etching depth using an output value indicating the concentration, the partial pressure, or the value related thereto.

The analysis device 100 is provided in a manner incorporated in an exhaust pipe H of a process chamber PC in which etching is performed, as illustrated in FIG. 1, and is configured to analyze a reaction product contained in a gas (hereinafter, referred to as a target gas) that flows through the exhaust pipe H. In this embodiment, the exhaust pipe H is provided with a turbo molecular pump TMP and a dry pump DP, and the analysis device 100 is disposed between the turbo molecular pump TMP and the dry pump DP, without limitation thereto.

Figure 2:
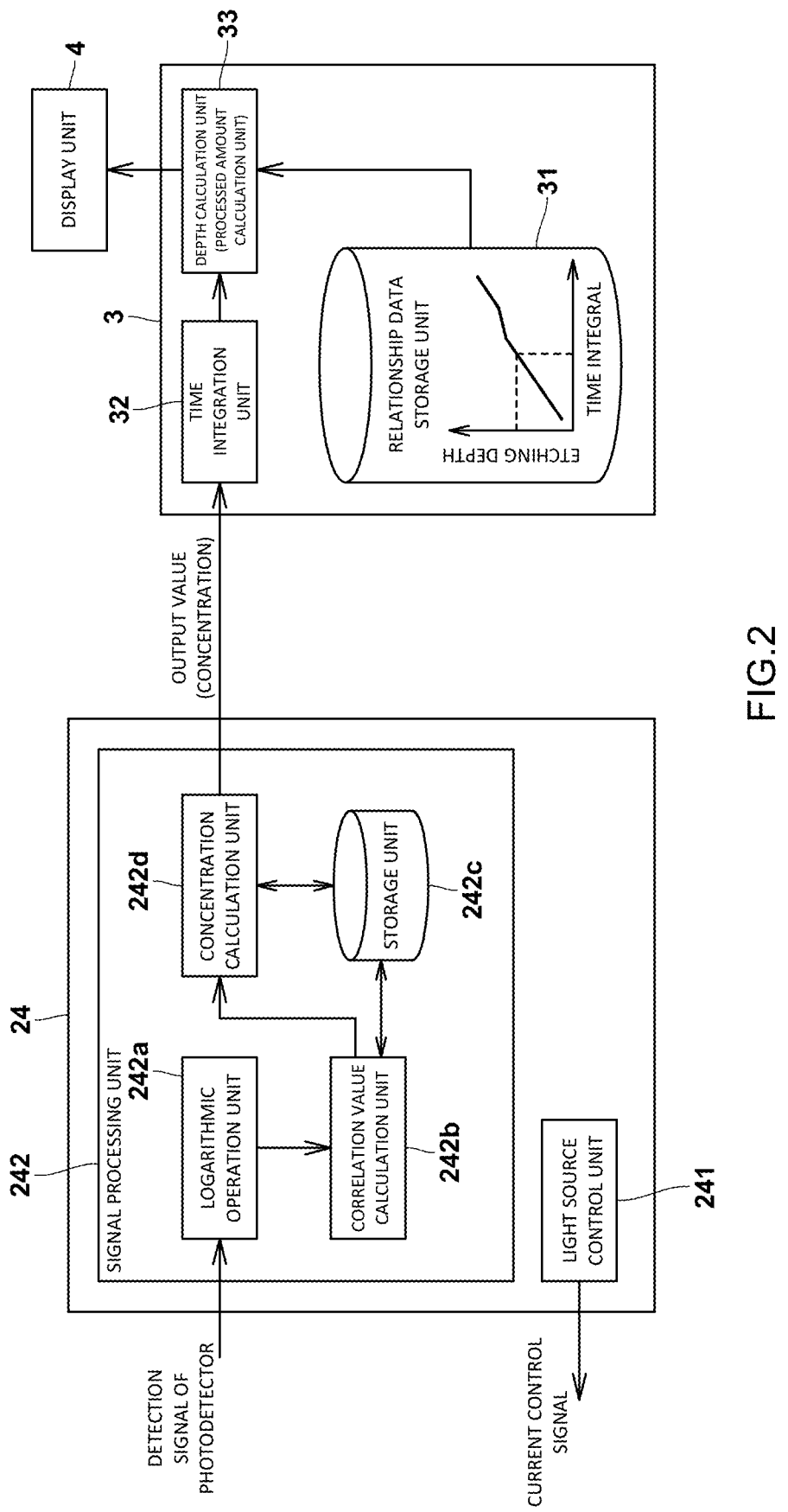
FIG. 2 is a functional configuration diagram of a signal processing device and an operation unit included in a measurement unit according to the embodiment.

Specifically, as illustrated in FIGS. 1 and 2, the analysis device 100 includes: a measurement unit 2 that measures the concentration or the partial pressure of a reaction product generated as the workpiece W is etched, or a value related to the concentration or the partial pressure; and an operation unit 3 that calculates the etching depth of the workpiece W using the output value from the measurement unit 2.

<Configuration of Measurement Unit 2>

The measurement unit 2 is configured to measure the concentration of the reaction product (in the example herein, $SiF_4$) contained in the target gas continuously, and an example of the measurement unit 2 is a unit that uses infrared laser absorption modulation (see Japanese Patent No. 6886507; Infrared Laser Absorption Modulation (IR-LAM)), for example.

Specifically, as illustrated in FIGS. 1 and 2, the measurement unit 2 includes a measurement cell 21 that includes a pair of multi-reflection mirrors M1 and M2 having a target gas therebetween; a semiconductor laser 22 that emits a laser beam into the measurement cell 21 and causes the laser beam to become incident between the pair of multi-reflection mirrors M1 and M2; a photodetector 23 that detects the laser beam having come out between the pair of multi-reflection mirrors M1 and M2 and having passed through the measurement cell 21; and a signal processing device 24 that calculates the concentration or the partial pressure of the reaction product based on a detection signal from the photodetector 23.

The measurement cell 21 is what is called a Herriott cell, in which a pair of multi-reflection mirrors M1 and M2 are provided to multi-reflect the laser beam. Other than the Herriott cell, the measurement cell 21 may also be a white cell having a plurality of multi-reflection mirrors having the target gas therebetween, or may be a ring cell having an annular multi-reflection mirror that surrounds the target gas.

The semiconductor laser 22 is a quantum-cascade laser. A quantum-cascade laser is a semiconductor laser that uses intersubband transition with a multistage quantum well structure, and oscillates a laser beam at a specific wavelength within a wavelength range between approximately 4 μm and approximately 20 μm. The semiconductor laser 22 can modulate (change) the oscillation wavelength using a given current (or voltage).

In this example, as the photodetector 23, a relatively inexpensive thermal photodetector such as a thermopile is used, but it is also possible to use another type of photodetector such as a quantum-well photoelectric element that is highly responsive, such as those using HgCdTe, InGaAs, InAsSb, or PbSe.

The signal processing device 24 includes an analog electric circuit including a buffer and an amplifier, for example, a digital electric circuit including a CPU and a memory, for example, and elements such as an AD converter and a DA converter that serve as a mediator between the analog electric circuit and the digital electric circuit.

The signal processing device 24 then exerts a function as a light source control unit 241 that controls the output of the semiconductor laser 22, and a function as a signal processing unit 242 that receives detection signals from the photodetector 23, and that performs an operation on the values of the detection signals to calculate the concentration or the partial pressure of the target component, or a value related to the concentration or the partial pressure, as illustrated in FIG. 2, by causing the CPU and peripheral devices to work in cooperation with one another in accordance with a predetermined program stored in a predetermined area of the memory. An example of the value related to the concentration or the partial pressure includes an absorption intensity having a correlation with the concentration or the partial pressure.

These devices will now be explained in detail one by one. In the explanation hereunder, an example in which the signal processing unit 242 calculates the concentration of a target component will be used.

The light source control unit 241 outputs a current (or voltage) control signal to control a current source (or a voltage source) of the semiconductor laser 22. Specifically, the light source control unit 241 changes a driving current (or a driving voltage) for the semiconductor laser 22 at a predetermined frequency, and modulates the oscillation wavelength of the laser beam output from the semiconductor laser 22 at the predetermined frequency, with respect to a center wavelength (see FIG. 3). The semiconductor laser 22 is thus caused to emit modulated light having been modulated at the predetermined modulation frequency.

Figure 3:
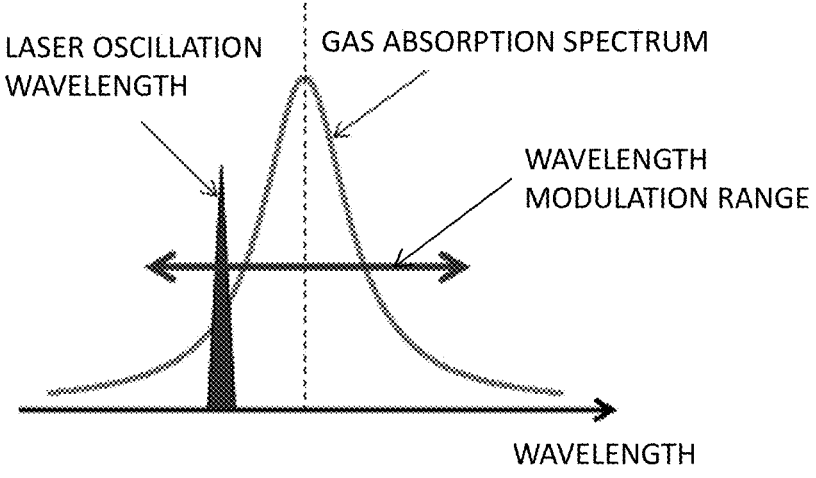
FIG. 3 is a schematic diagram illustrating a method for modulating a laser oscillation wavelength in the embodiment.
Figure 4:
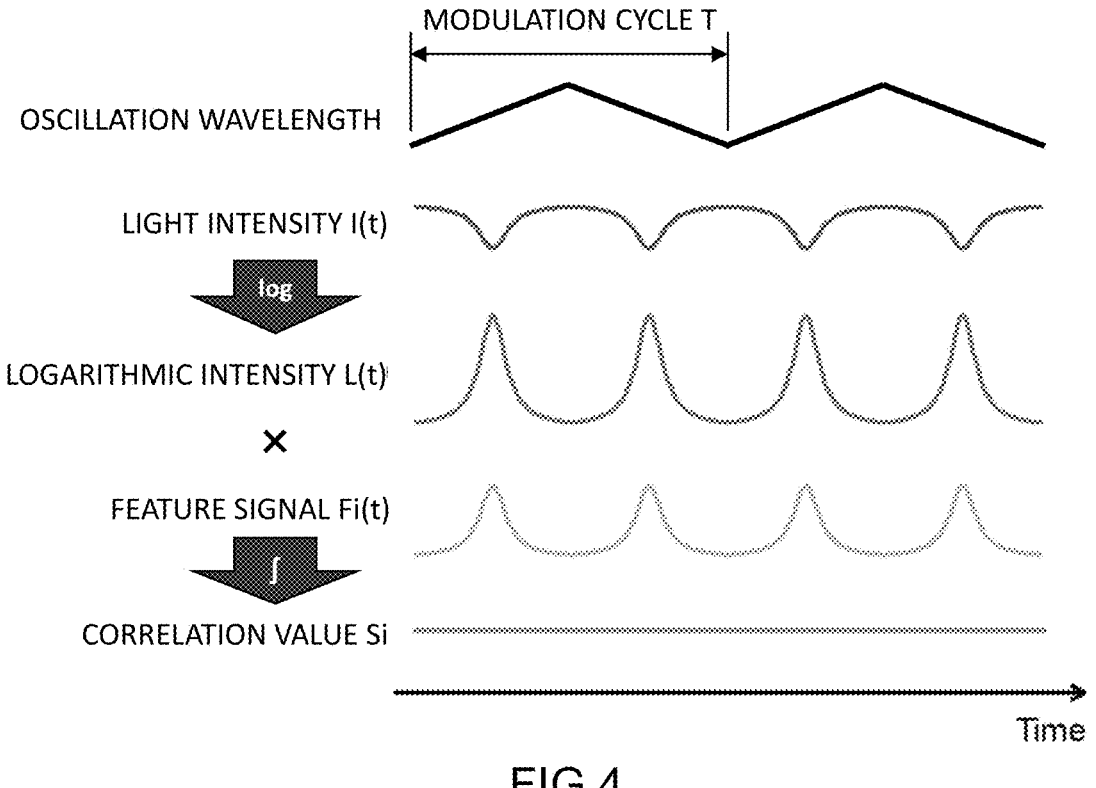
FIG. 4 is a time-series graph illustrating an example of an oscillation wavelength, a light intensity I(t), a logarithmic intensity L(t), a feature signal $F_i(t)$, and a correlation value $S_i(t)$ according to the embodiment.

In this embodiment, the light source control unit 241 changes the driving current to a triangular wave, and modulates the oscillation frequency to a triangular wave (see "oscillation wavelength" in FIG. 4). In practice, the driving current is modulated by another function so that the oscillation frequency delineates a triangular waveform. As illustrated in FIG. 3, the oscillation wavelength of the laser beam is modulated using the peak of the light absorption spectrum of the target component as the center wavelength. The light source control unit 241 may also change the driving current to a sinusoidal form, a saw teeth form, or any arbitrary functional form to modulate the oscillation frequency to a sinusoidal form, a saw-teeth form, or any arbitrary functional form.

The signal processing unit 242 includes a logarithmic operation unit 242a, a correlation value calculation unit 242b, a storage unit 242c, and a concentration calculation unit 242d.

The logarithmic operation unit 242a executes a logarithmic operation to a light intensity signal that is the detection signal from the photodetector 23. A function I(0 that represents temporal changes in the light intensity signal obtained by the photodetector 23 over time is plotted as indicated as "light intensity I(t)" in FIG. 4, and a plot resultant of the logarithmic operation is as indicated as "logarithmic intensity L(t)" in FIG. 4.

The correlation value calculation unit 242b calculates a correlation value between an intensity-related signal that is related to the intensity of sample light acquired at the time of a target gas measurement, and each of a plurality of predetermined feature signals. A feature signal is a signal for extracting a feature of the waveform of the intensity-related signal, by establishing a correlation with the intensity-related signal. As the feature signal, a sine wave signal or signals of other various types corresponding to the waveform features to be extracted from the intensity-related signal may be used. In the example herein, the correlation value calculation unit 62 uses a light intensity signal resultant of the logarithmic operation (logarithmic intensity L(t)) as the intensity-related signal.

The correlation value calculation unit 242b also calculates, using the equation below (Equation 1), a plurality of sample correlation values $S_i$ each of which represents a correlation between the intensity-related signal corresponding to the sample light, and corresponding one of the plurality of feature signals $F_i(t)$ (i=1, 2, . . . , n) the number of which is greater than the sum of the number of the types of target components (in this embodiment, the number of reaction products) and the number of types of interference components. Note that T in Equation 1 denotes a modulation cycle.

$$S_i = \int_0^T L(t) \cdot F_i(t) dt \, (i = 1, 2, \ldots, n) \qquad \text{[Equation 1]}$$

$$R_i = \int_0^T L_0(t) \cdot F_i(t) dt \, (i = 1, 2, \ldots, n)$$

$$S_i' = S_i - R_i$$

When the sample correlation values are calculated, the correlation value calculation unit 242b preferably calculates corrected sample correlation values $S_i'$. This correction is made by subtracting a reference correlation value $R_i$ from the corresponding correlation value $S_i$ of the intensity-related signal L(t) of the sample light with respect to corresponding one of the plurality of feature signals $F_i(t)$, where the reference correlation value $R_i$ is a value of correlation between an intensity-related signal $L_0(t)$ corresponding to reference light, and corresponding one of the plurality of feature signals $F_i(t)$, as indicated in Equation 1. In this manner, it is possible to achieve correlation values that are proportional to concentrations of the target component and of the interference component, with offsets included in the sample correlation values removed. Therefore, the measurement error can be reduced. Note that a configuration not subtracting the reference correlation values is also possible.

The reference light may be obtained at the same time as when the sample light is obtained, before or after the measurement, or any timing. The intensity-related signal of the reference light or the reference correlation values corresponding to the reference light may be obtained and stored in the storage unit 242c in advance. A possible method for obtaining the reference light at the same time includes, for example, providing two photodetectors 23, splitting the modulated light from the semiconductor laser 22 with a beam splitter or the like, and using one for the measurement of the sample light and the other for the measurement of the reference light.

In this embodiment, the correlation value calculation unit 242b uses a function better capable of capturing a waveform feature of the logarithmic intensity L(t), being better than that achieved with a sine function, as the plurality of feature signals $F_i(t)$. When the sample gas contains the target component and one interference component, two or more feature signals $F_1(t)$ and $F_2(t)$ may be used. As the two or more feature signals $F_1(t)$ and $F_2(t)$, a function based on a Lorentz function that is close to the form of the absorption spectrum, and a differential function that is based on the Lorentz function may be used, for example. As feature signals, a function based on the Voigt function or a function based on the Gaussian function may also be used, instead of the function based on the Lorentz function, for example. By using such functions for the feature signals, it is possible to achieve higher correlation values, compared with those obtained with a sine function. Therefore, measurement precision can be improved.

At this time, it is preferable to control the offset so that the DC component of the feature signal is removed, that is, so that the offset resultant of integrating the feature signal over the modulation cycle becomes zero. In this manner, the effect resultant of the offset added to the intensity-related signal, the offset being added due to a fluctuation in the light intensity, can be removed. It is also possible to, instead of removing the DC component of the feature signal, remove the DC component of the intensity-related signal, or to remove the DC component of both of the feature signal and the intensity-related signal. Furthermore, it is also possible to use sampled values of absorption signals corresponding to the target component and/or the interference component, or simulations thereof, as the feature signals.

Note that by setting the two feature signals $F_1(t)$ and $F_2(t)$ to orthogonal functions that are orthogonal to one another, or to functions close to orthogonal functions, the features of the logarithmic intensities L(t) can be extracted more efficiently, and the precisions of the concentrations obtained by simultaneous equations, which will be described later, can be improved.

The storage unit 242c stores therein sole correlation values. A sole correlation value is a per-unit concentration correlation value corresponding to each of the target component and the interference component, the sole correlation value being obtained from the intensity-related signal obtained while only the target component or interference components is present, and from each of the plurality of feature signals $F_i(t)$. The feature signals $F_i(t)$ used in obtaining the sole correlation values are the same as the plurality of feature signals $F_i(t)$ used in the correlation value calculation unit 242b.

When the sole correlation values are stored, the storage unit 242c preferably stores therein the sole correlation values resultant of subtracting the reference correlation values from the respective correlation values of the time when there is only one of the target component and interference components, and of applying a correction for converting the sole correlation values into correlation values per unit concentration. The resultant correlation values are correlation values having the offsets in the sole correlation values removed, and being proportional to the concentrations of the target component and of the interference component. Therefore, it is possible to reduce the measurement errors. Note that a configuration not subtracting the reference correlation values is also possible.

The concentration calculation unit 242d calculates the concentration of the target component using the sample correlation values obtained by the correlation value calculation unit 242b.

Figure 5:
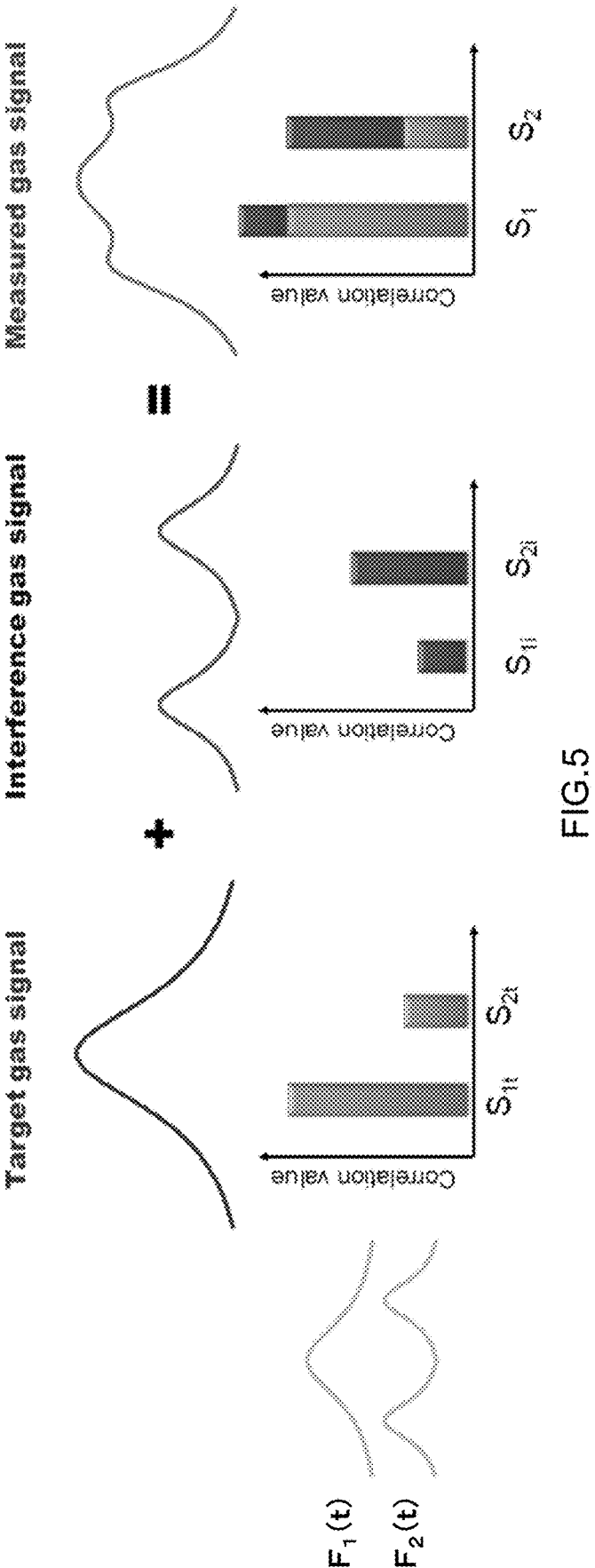
FIG. 5 is a conceptual diagram of a concentration or partial pressure calculation using sole correlation values and sample correlation values according to the embodiment.

Specifically, the concentration calculation unit 242d calculates the concentration of the target component based on the plurality of sample correlation values obtained by the correlation value calculation unit 242b and the plurality of sole correlation values stored in the storage unit 242c. More specifically, the concentration calculation unit 242d calculates the concentration of the target component by solving simultaneous equations including the plurality of sample correlation values obtained by the correlation value calculation unit 242b, the plurality of sole correlation values stored in the storage unit 242c, and the concentrations of the target component and the interference components. FIG. 5 is a conceptual diagram of concentration or partial pressure calculation using the sole correlation value and the sample correlation value in the concentration calculation unit 242d.

When the target gas contains one measurement target component (in the example herein, $SiF_4$) and one interference component, the concentration calculation unit 242d solves the following simultaneous binary equations including the sample correlation values $S_1'$ and $S_2'$ calculated by the correlation value calculation unit 242b, the sole correlation values $s_{1t}$, $s_{2t}$, $s_{1i}$, and $s_{2i}$ in the storage unit 242c, and the concentrations $C_{tar}$ and $C_{int}$ of the target component and the interference component, respectively. $s_{1t}$ denotes a sole correlation value of the target component in the first feature signal; $s_{2t}$ denotes a sole correlation value of the target component in the second feature signal; $s_{1i}$ denotes a sole correlation value of the interference component in the first feature signal; and $s_{2i}$ denotes a sole correlation value of the interference component in the second feature signal.

$$s_{1t}C_{tar}+s_{1i}C_{int}=S_1'$$

$$s_{2t}C_{tar}+s_{2i}C_{int}=S_2' \qquad \text{[Equation 2]}$$

As a result, the concentration $C_{tar}$ of the target component (reaction product) with the interference effect removed can be determined by a simple and reliable operation of solving the simultaneous equations indicated as the above equation (Equation 2).

Note that, even when there are possibly two or more interference components the effects of which are to be removed, by adding the sole correlation values corresponding to the number of interference components, and solving simultaneous equations having the same number of elements as the number of types of the components, it is possible to determine the concentration of the target component with the effects of the interference removed, in the same manner.

<Configuration of Operation Unit 3>

The operation unit 3 that calculates the etching depth of the workpiece W using the output value of the measurement unit 2 will now be explained. In the example explained herein, the output value of the measurement unit 2 is the concentration of the reaction product obtained by the signal processing unit 242 or a value related to the concentration.

The operation unit 3 includes an analog electric circuit including a buffer and an amplifier, for example, a digital electric circuit including a CPU and a memory, for example, and elements such as an AD converter and a DA converter that serves as a mediator between the analog electric circuit and the digital electric circuit.

By causing the CPU and the peripheral devices to work in cooperation with one another in accordance with a predetermined analysis program stored in a predetermined area of the memory, the operation unit 3 comes to include, as illustrated in FIG. 2, a relationship data storage unit 31 that stores therein relationship data for determining an etching depth (processed amount); a time integration unit 32 that calculates a time integral obtained by integrating an output value of the measurement unit 2 with respect to time; and a depth calculation unit (processed amount calculation unit) 33 that calculates the etching depth (processed amount) from the time integral obtained by the time integration unit 32 and the relationship data.

The relationship data storage unit 31 stores therein relationship data indicating a relationship of the time integral obtained by integrating the output value of the measurement unit 2 with respect to time, and the etching depth. This relationship data is created in advance and stored in the relationship data storage unit 31.

A method of creating the relationship data will now be explained.

To begin with, the workpiece W is etched, and the output values of the measurement unit 2 are integrated over time (0 to t1) to obtain a time integral $G_{t1}$.

A weight $W_{t1}$ of the etched workpiece W is also measured, and a difference $(W_0-W_{t1})$ between the weight $W_{t1}$ and the initial weight $W_0$ is calculated. The etching depth d is then calculated with the following equation that uses the density $\rho$ of the workpiece (etched film) and the area A of the etched region.

$$d_{t1}=(W_0-W_{t1})/(\rho \times A)$$

Relationship data is then generated from the calculated time integral $G_{t1}$ and the calculated etching depth $d_{t1}$. The relationship data may be created using one set of data $(G_{t1}, d_{t1})$ up to the point in time t1, as described above, or may be created using a plurality of sets of data $(G_{t1}, d_{t1})$ to $(G_{tn}, d_{tn})$ at a plurality of respective time points (t1, t2, . . . tn). Furthermore, it is also possible to create the relationship data for each kind of the workpiece W, e.g., layer structure or material.

The time integration unit 32 receives the output values of the measurement unit 2 and time-integrates the output values to calculate a time integral $G_T$. At this time, the time integration unit 32 integrates the output values of the measurement unit 2 with respect to an elapsed time TE from when the etching is started. The output values of the measurement unit 2 in this embodiment are concentrations calculated by the concentration calculation unit 242*d*.

The depth calculation unit (processed amount calculation unit) 33 receives the time integral $G_T$ calculated by the time integration unit 32, and calculates the etching depth $d_T$ from the relationship data stored in the relationship data storage unit 31. Note that the etching depth $d_T$ obtained by the depth calculation unit 33 may be displayed on the display unit 4 such as a display, or may be output in another form, e.g., transmitted as data to another device. The display unit 4 may also display a graph indicating the output values of the measurement unit 2 or a temporal change thereof, or display an etching rate. In addition, the operation unit 3 may include a notification unit that issues a warning or the like upon satisfaction of a predetermined condition, e.g., the etching depth $d_T$ obtained by the depth calculation unit 33 exceeding a predetermined threshold value.

Advantageous Effects Achieved by Present Embodiment

With the analysis device 100 according to this embodiment having a configuration described above, the reaction product generated as the workpiece W is etched is measured by multi-reflection semiconductor laser spectroscopy. Therefore, it is possible to measure the concentration or partial pressure of the reaction product precisely. Furthermore, because the etching depth is calculated using the relationship between the etching depth and the time integral obtained by integrating the output values of the measurement unit 2 with respect to time, it is possible to monitor the etching depth precisely.

In particular, in this embodiment, because the IRLAM is used in the measurement unit 2, it is possible to reduce the effect of interference due to an interference component different from the reaction product, which is the target component. As a result, it becomes possible to measure the concentration of the reaction product highly precisely, to improve the precision of the relationship data, and to calculate the etching depth highly precisely.

FIG. 6 illustrates experimental results showing a correlation between the output values of the measurement unit (IRLAM) according to the embodiment and the etching rate, and a correlation between the output values of a conventional plasma emission monitor (OES) and the etching rate. Workpieces having the same structures were etched under the same "1st" and "2nd" etching conditions, and a correlation between the measurement unit 2 according to this embodiment and the etching rate (IRLAM vs ER), and a correlation between the conventional plasma emission monitor (OES) and the etching rate (OES vs ER) were obtained under each of these etching conditions.

As the experimental results indicate, the correlation between the etching rate and the output values of the measurement unit 2 according to this embodiment is reproducible and always exhibits excellent linearity. Because the correlation between the etching rate and the output values is reproducible, it can be seen that the correlation between the time integral of the etching rate (etching depth) and the time integral of the output values is also reproducible. By contrast, the correlation between the etching rate and the output values of the conventional plasma emission monitor (OES) lacks reproducibility, and even the sign ($\pm$) of the gradient sometimes changes.

Other Embodiments

Figure 7:
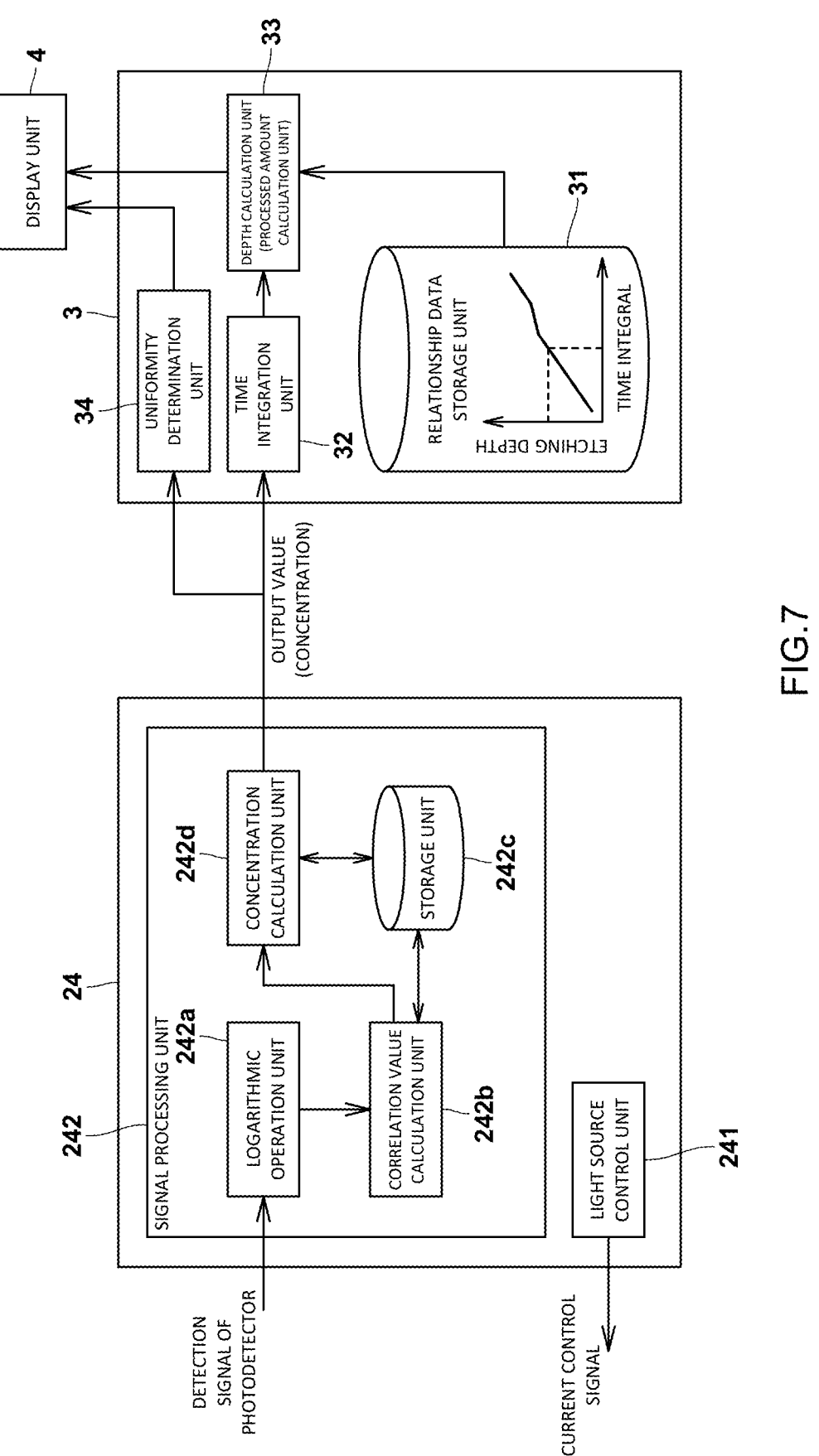
FIG. 7 is a functional configuration diagram of a signal processing device and an operation unit included in a measurement unit according to a modification.

For example, as illustrated in FIG. 7, the operation unit 3 may further include a uniformity determination unit 34 that determines uniformity of the etching based on a temporal change in the output values of the measurement unit 2. The uniformity determination unit 34 determines the uniformity of etching based on the gradient of the temporal change of the output values of the measurement unit 2.

Figure 8:
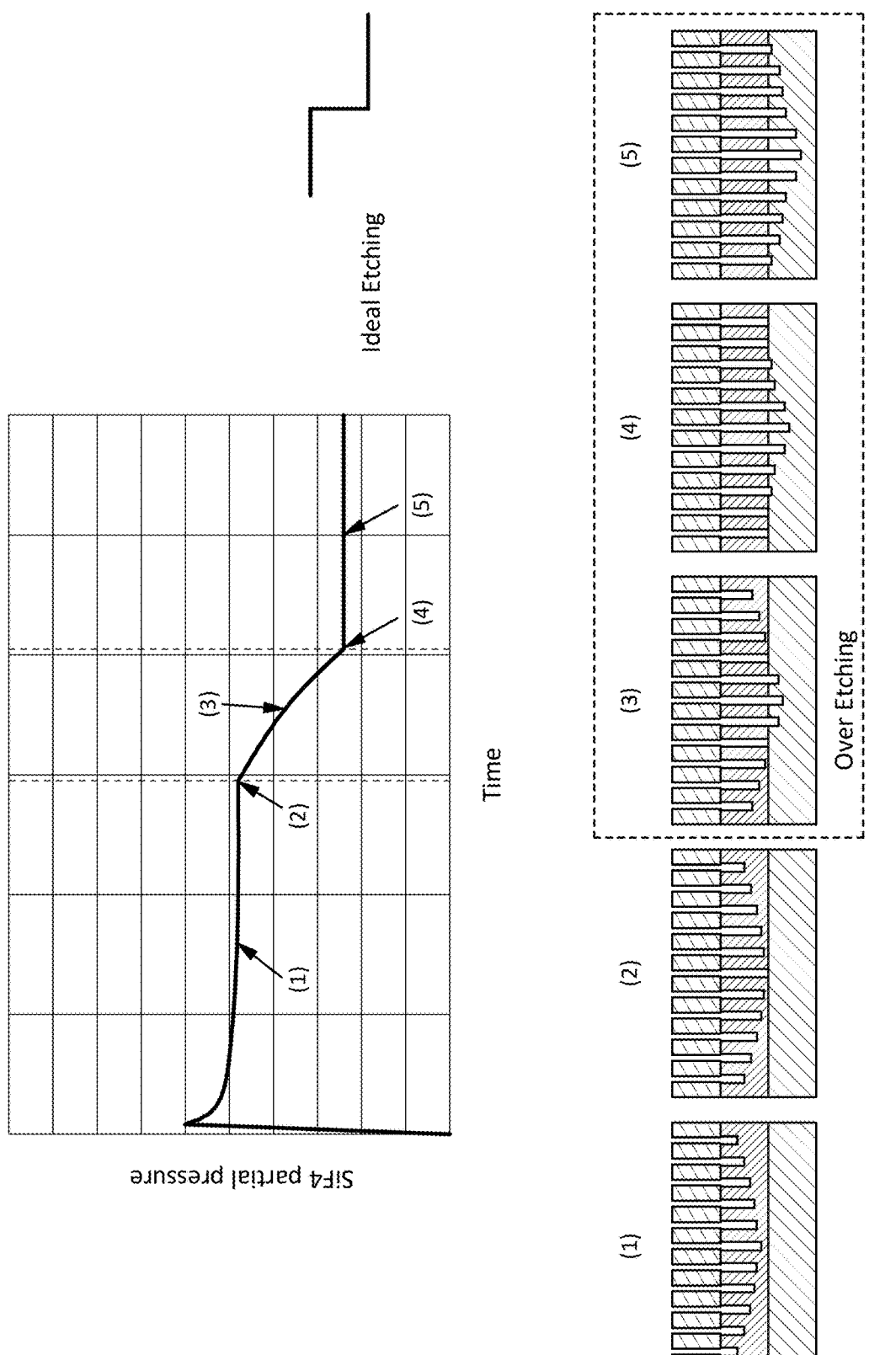
FIG. 8 is a diagram illustrating stages of etching, and output values from the measurement unit in the respective stages in the modification.

Here, when etched is a workpiece including a resist film provided on a semiconductor substrate that is a Si substrate having an $SiO_2$ film formed thereon, the output values of the measurement unit 2 (in the example herein, a partial pressure of $SiF_4$) are as illustrated in FIG. 8, due to an in-plane distribution of the etching rate.

In FIGS. 8, (1) and (2) are periods in which only the $SiO_2$ film of the semiconductor substrate is being etched, and (3) illustrates a period in which not only the $SiO_2$ film but also the Si substrate of the semiconductor substrate are being etched. (4) and (5) are periods in which the etching of the $SiO_2$ film on the semiconductor substrate has finished and only etching of the Si substrate is being continued. The uniformity of etching can be determined by the gradient of the temporal change in the output values during the period (3). When the gradient of the temporal change in the output values during the period (3) is steep, it indicates that the in-plane etching distribution is high; and when the gradient is gradual, it indicates that the uniformity in the in-plane etching distribution is low.

For example, it is possible for the uniformity determination unit 34 to determine the uniformity of the in-plane etching distribution by comparing the gradient of the temporal change in the output values, such a change being caused by a change in the layer being etched, with a predetermined threshold value.

The operation unit 3 may also include a processing determination unit 35 that determines that the processing speed for the workpiece has changed based on the temporal change in the output values of the measurement unit 2.

For example, when the thickness of the film being etched is known, the processing determination unit 35 determines that the etching grade has changed based on a temporal change in the output values of the measurement unit 2 while a film of the same type being etched. Specifically, it is quite possible for the output values of the measurement unit 2 to remain constant or substantially constant while a film of the same type is being etched unless the etching conditions are changed. Under such a condition, if the output value increases or decreases by a predetermined level or more, as illustrated in FIG. 9, the processing determination unit 35 determines that the etching rate is unstable. Note that it is possible to determine that the output values are those being output while a film of the same type is being etched, and not those during the transition period in which the film being etched changes, by obtaining the etching depth from the time integral of the output values and the relationship data, and by comparing the etching depth with a known film thickness. In other words, when the etching depth obtained from the time integral of the output values and the relationship data is smaller than the known film thickness, it can be determined that the same type of film is being etched.

Furthermore, the operation unit 3 may also include a variability calculation unit 36 that calculates a variability in the processed amount within the plane of the workpiece based on a temporal change in the output values of the measurement unit 2.

As illustrated in FIG. 10, the variability calculation unit 36 can calculate the maximum etching depth and the minimum etching depth within a first stable period (while only a first layer is being etched), a transition period following the stable period (while the first layer and a second layer below the first layer are being etched), and a second stable period following the transition period (while only the second layer is being etched) in the output value of the measurement unit 2.

Denoting the highest etching rate as $x_1$, the lowest etching rate as $x_2$, an average etching rate as $x_{ave}$, the time point at which the first stable period ends as $t_1$, and the time point at which the transition period ends as $t_2$, a film thickness h of the first layer from the time integral G of the output values of the measurement unit 2 can be calculated, and will be in the following relationships.

$$t_1 = h/x_1, t_2 = h/x_2$$

Based on these equations, $t_2/t_1 = x_1/x_2$ $(t_2:t_1 = x_1:x_2)$ is established.

Based on this relationship, $t_2:t_1:t_{ave} = x_1:x_2:x_{ave}$, and, because $t_1$, $t_2$, and $x_{ave}$ are known and because $t_{ave} = (t_1 + t_2)/2$, it is possible to obtain $x_1$ and $x_2$. Note that $x_{ave}$ is obtained by dividing the average etching depth, which is obtained from the time integral and the relationship data, by time, or may be obtained from the correlation between the etching rate and the output values.

As a result, it is possible to calculate the maximum etching depth $(x_1 \times t_2)$ and the minimum etching depth $(x_2 \times t_2)$, and to determine the variability in the etching depth.

Figure 11:
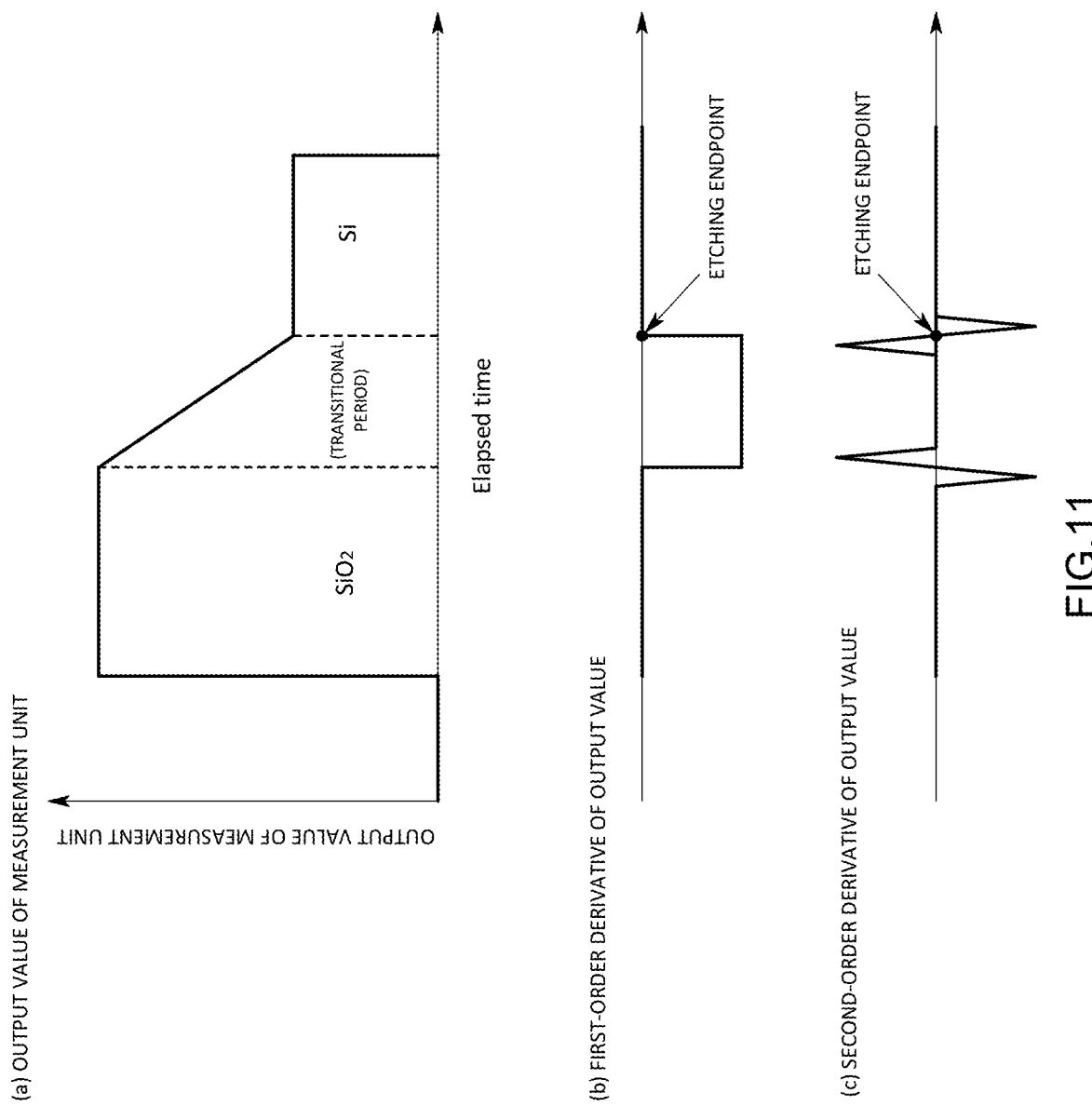
FIG. 11 is a diagram illustrating a method of calculating an etching end point (end point) according to a modification.

In addition, as illustrated in FIG. 11, the operation unit 3 may calculate the point at which the etching is ended (end point) by calculating a first-order derivative or a second-order derivative of the output values of the measurement unit 2. Illustrated herein is an example in which the workpiece includes a first layer ($SiO_2$) and a second layer (Si), and in which the time point of completion of the transition period from the first layer ($SiO_2$) to the second layer (Si) is detected as an end point.

The measurement unit 2 according to the embodiment described above has a zero calibration function of performing zero calibration while the etching is not being performed. More specifically, the measurement unit 2 has a zero calibration function for performing zero calibration while there is no reaction product in the process chamber PC, for example, (1) in a condition in which the workpiece W is not being processed and the process chamber PC has been vacuumed, or (2) in a condition in which the workpiece W is not being processed and a flow of inert gas such as nitrogen or argon is being introduced into the process chamber PC. As a result, it is possible to reduce error factors such as components adhered inside of the process chamber PC or contamination of the optical window, so that the reaction product can be measured precisely.

Furthermore, the measurement unit 2 according to the embodiment described above has been explained to measure the concentration of the reaction product or a value related to the concentration, but may also measure the partial pressure of the reaction product in the target gas or a value related to the partial pressure. In this case, the measurement unit 2 outputs a partial pressure of the reaction product obtained by the signal processing unit 242 or a value related to the partial pressure as the output value.

Furthermore, in the above embodiment, the measurement unit 2 is incorporated in the exhaust pipe H of the process chamber PC, but may be provided in a bypass pipe branched out from the exhaust pipe H, or may be provided in a measurement pipe connected to the process chamber PC separately from the exhaust pipe H. In addition, a pair of multi-reflection mirrors M1 and M2 may be provided inside the process chamber PC, or may be connected to a wall such as a side wall or an upper wall surrounding the process chamber PC.

In addition, the functions of the signal processing device 24 and the operation unit 3 of the measurement unit 2 according to the embodiment may be provided to one computer (information processing device).

In the above embodiment, the etching processing is used as an example of the semiconductor processing, and the configuration for calculating the etching depth or the like has been explained. However, the semiconductor processing may be another processing such as film deposition processing, and the thickness or the like of a film having deposited may be calculated by measuring a reaction product generated in the processing. The processing may also be cleaning processing for cleaning the process chamber or a workpiece such as a wafer, and the processed amount may be calculated thereby. The present invention is also applicable to a manufacturing process of an organic EL, a solar cell, or the like.

In addition, various modifications and combinations of the embodiment may be made within the scope not deviating from the gist of the present invention.

REFERENCE SIGNS LIST

100 analysis device
W workpiece
2 measurement unit
M1, M2 multi-reflection mirror
22 semiconductor laser (laser light source)
23 photodetector
242 signal processing unit
3 operation unit
31 relationship data storage unit
32 time integration unit
33 depth calculation unit (processed amount calculation unit)
34 uniformity determination unit

What is claimed is:

1. An analysis device comprising:
a signal processing device that measures a concentration, a partial pressure, or a value related to the concentration or the partial pressure of a reaction product generated while a workpiece is being processed in workpiece processing;
a first processor configured to calculate a processed amount by which the workpiece is processed, using an output value of the signal processing device; and
a memory configured to store relationship data indicating a relationship between a time integral of integrating an output value of the signal processing device with respect to time, and a processed amount by which the workpiece is processed in the workpiece processing, wherein
the signal processing device includes
a laser light source that irradiates target gas containing the reaction product with a laser beam,
a photodetector that detects the laser beam having passed through the target gas, and a second processor configured to calculate the concentration, the partial pressure, or the value related to the concentration or the partial pressure of the reaction product based on a detection signal of the photodetector, and the first processor is configured to calculate a time integral by integrating the output value of the signal processing device with respect to time, calculate the processed amount by which the workpiece has been processed, from the time integral obtained by the first processor, and the stored relationship data, and calculate variability in the processed amount across a plane of the workpiece, based on a temporal change in the output value of the signal processing device.

2. The analysis device according to claim 1, wherein the first processor is further configured to determine that a speed at which the workpiece is processed has changed, based on a temporal change in the output value of the signal processing device.

3. The analysis device according to claim 1, wherein the signal processing device further includes multi-reflection mirrors, the laser light source causes a laser beam to become incident between the multi-reflection mirrors, and the photodetector detects light coming out from between the multi-reflection mirrors.

4. The analysis device according to claim 1, wherein the first processor is further configured to determine uniformity of the processed amount of the workpiece based on a temporal change in the output value of the signal processing device.

5. The analysis device according to claim 4, wherein the first processor is further configured to determine the uniformity of the processed amount of the workpiece based on a gradient of the temporal change in the output value of the signal processing device.

6. The analysis device according to claim 1, wherein the signal processing device has a zero calibration function for performing zero calibration, with no workpiece being processed.

7. The analysis device according to claim 1, wherein the workpiece processing is etching, and the processed amount of the workpiece is an etching depth.

8. A method of creating relationship data for the analysis device according to claim 1, the method, being performed by the second processor, comprising:

processing the workpiece in the workpiece processing;

calculating the time integral by integrating the output value of the signal processing device with respect to time;

calculating the processed amount, from a weight of the workpiece having been processed; and generating the relationship data from the time integral thus calculated and the processed amount thus calculated.

9. An analysis method using a signal processing device that measures a concentration, a partial pressure, or a value related to the concentration or the partial pressure of a reaction product generated while a workpiece is being processed in workpiece processing, the signal processing device including a laser light source that irradiates target gas containing the reaction product with a laser beam, a photodetector that detects the laser beam having passed through the target gas, and a processor configured to calculate the concentration, the partial pressure, or the value related to the concentration or the partial pressure of the reaction product based on a detection signal of the photodetector, the analysis method comprising:

calculating a time integral by integrating an output value of the signal processing device with respect to time;

calculating a processed amount of the workpiece using relationship data indicating a relationship between the time integral of integrating the output value of the signal processing device with respect to time, and the processed amount of the workpiece; and calculating variability in the processed amount across a plane of the workpiece, based on a temporal change in the output value of the signal processing device.

10. A computer-readable medium including an analysis program that is used in an analysis device including a signal processing device for measuring a concentration, a partial pressure, or a value related to the concentration or the partial pressure of a reaction product generated while a workpiece is being processed in workpiece processing, and that calculates a processed amount by which the workpiece is processed using an output value of the signal processing device, wherein the signal processing device includes a laser light source that irradiates target gas containing the reaction product with a laser beam, a photodetector that detects a laser beam having passed through the target gas, and a processor configured to calculate the concentration, the partial pressure, or the value related to the concentration or the partial pressure of the reaction product based on a detection signal of the photodetector, wherein the analysis program causes the processor to calculate a time integral obtained by integrating the output value of the signal processing device with respect to time;

store therein relationship data indicating a relationship between the time integral of integrating the output value of the signal processing device with respect to time, and a processed amount by which the workpiece is processed;

calculate a processed amount by which the workpiece has been processed, from the time integral obtained by the processor, and the relationship data; and calculate variability in the processed amount across a plane of the workpiece, based on a temporal change in the output value of the signal processing device.

* * * * *